(12) United States Patent
Abou-Khalil et al.

(10) Patent No.: US 10,163,892 B2
(45) Date of Patent: Dec. 25, 2018

(54) SILICON CONTROLLED RECTIFIERS (SCR), METHODS OF MANUFACTURE AND DESIGN STRUCTURES

(71) Applicant: INTERNATIONAL BUSINESS MACHINES CORPORATION, Armonk, NY (US)

(72) Inventors: Michel J. Abou-Khalil, Essex Junction, VT (US); Kiran V. Chatty, Oviedo, FL (US); Robert J. Gauthier, Jr., Hinesburg, VT (US); Junjun Li, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 46 days.

(21) Appl. No.: 14/526,580

(22) Filed: Oct. 29, 2014

(65) Prior Publication Data

US 2015/0048416 A1 Feb. 19, 2015

Related U.S. Application Data

(63) Continuation of application No. 12/985,840, filed on Jan. 6, 2011, now Pat. No. 8,906,751.

(51) Int. Cl.
*H01L 27/02* (2006.01)
*H01L 29/08* (2006.01)
(Continued)

(52) U.S. Cl.
CPC ...... *H01L 27/0262* (2013.01); *G06F 17/5045* (2013.01); *H01L 29/0649* (2013.01);
(Continued)

(58) Field of Classification Search
CPC ........... H01L 29/66393; H01L 29/0839; H01L 29/7436; H01L 29/0649; H01L 27/0262; G06F 17/5045
See application file for complete search history.

(56) References Cited

U.S. PATENT DOCUMENTS 5,828,110 A * 10/1998 Wollesen ............ H01L 27/0921
257/370
5,872,379 A 2/1999 Lee
(Continued)

FOREIGN PATENT DOCUMENTS

CN 1435883 8/2003
CN 1469468 1/2004
(Continued)

OTHER PUBLICATIONS

Affidavit of Richard M. Kotulak under 37 CFR 1.132 for U.S. Appl. No. 12/985,840, Nov. 30, 2011, pp. 1-6, noting activities prior to Jan. 6, 2011.
(Continued)

*Primary Examiner* — Dale E Page
*Assistant Examiner* — Quovaunda V Jefferson
(74) *Attorney, Agent, or Firm* — Anthony Canale; Andrew M. Calderon; Roberts Mlotkowski Safran Cole & Calderon, P.C.

(57) ABSTRACT

Silicon controlled rectifiers (SCR), methods of manufacture and design structures are disclosed herein. The method includes forming a common P-well on a buried insulator layer of a silicon on insulator (SOI) wafer. The method further includes forming a plurality of silicon controlled rectifiers (SCR) in the P-well such that N+ diffusion cathodes of each of the plurality of SCRs are coupled together by the common P-well.

20 Claims, 5 Drawing Sheets

(51) Int. Cl.
*H01L 29/66* (2006.01)
*H01L 29/74* (2006.01)
*G06F 17/50* (2006.01)
*H01L 29/06* (2006.01)

(52) U.S. Cl.
CPC .... *H01L 29/0839* (2013.01); *H01L 29/66393* (2013.01); *H01L 29/7436* (2013.01)

(56) References Cited

U.S. PATENT DOCUMENTS

| | | |
|---|---|---|
| 6,194,290 B1 | 2/2001 | Kub et al. |
| 6,594,132 B1 | 7/2003 | Avery |
| 6,653,175 B1 | 11/2003 | Nemati et al. |
| 6,898,062 B2 | 5/2005 | Russ et al. |
| 6,921,931 B2 | 7/2005 | Higashi et al. |
| 7,291,887 B2 | 11/2007 | Chiu et al. |
| 7,479,414 B2 | 1/2009 | Salcedo et al. |
| 7,566,914 B2 | 7/2009 | Salcedo et al. |
| 7,589,944 B2 | 9/2009 | Mergens et al. |
| 7,714,356 B2 | 5/2010 | Abou-Khalil et al. |
| 7,777,248 B1 | 8/2010 | Boyd et al. |
| 8,525,600 B1 | 9/2013 | Vendryes et al. |
| 2002/0135315 A1 | 9/2002 | Puleo, Sr. et al. |
| 2003/0146474 A1* | 8/2003 | Ker et al. ............ 257/347 |
| 2004/0080883 A1 | 4/2004 | Chatterjee et al. |
| 2004/0136127 A1 | 7/2004 | Kodama et al. |
| 2005/0083619 A1 | 4/2005 | Steinhoff |
| 2006/0011939 A1 | 1/2006 | Mohn et al. |
| 2006/0249759 A1 | 11/2006 | Morris |
| 2008/0002321 A1 | 1/2008 | Sorgeloos et al. |
| 2009/0101938 A1 | 4/2009 | Vanysacker et al. |
| 2009/0189183 A1 | 7/2009 | Hung |
| 2009/0206367 A1 | 8/2009 | Gauthier, Jr. et al. |
| 2009/0309129 A1* | 12/2009 | Domanski ........... H01L 27/0262 257/133 |
| 2010/0032759 A1 | 2/2010 | Chang et al. |
| 2010/0140659 A1 | 6/2010 | Ker et al. |

FOREIGN PATENT DOCUMENTS

| | | |
|---|---|---|
| DE | 102009013331 | 12/2009 |
| JP | 2002110987 | 4/2002 |

OTHER PUBLICATIONS

Submission of Information for U.S. Appl. No. 12/985,840, IBM, pp. 1-3, noting activities prior to Jan. 6, 2011.
Mergens et al., "Advanced SCR ESD Protection . . . Nanotechnologies", SOFICS Solutions for ICs, 2010, 10 pages.
International Search Report for Application No. PCT/US2012/020399 dated May 7, 2012.
Written Opinion of the International Searching Authority for Application No. PCT/US2012/020399 dated May 7, 2012.

* cited by examiner

SILICON CONTROLLED RECTIFIERS (SCR), METHODS OF MANUFACTURE AND DESIGN STRUCTURES

FIELD OF THE INVENTION

The invention relates to semiconductor structures and methods of manufacture and, more particularly, to silicon controlled rectifiers (SCR), methods of manufacture and design structures.

BACKGROUND

Semiconductor devices and more particularly integrated circuits (IC) are very sensitive to high voltages that may be generated by an electrostatic discharge (ESD) event. For example, an ESD event can lead to pulses of high current (several amperes) of a short duration within an IC, which can lead to failure of the IC. For this reason, ESD protection circuitry is essential to ensure that ICs are not destroyed during an ESD event.

Silicon controlled rectifiers (SCR) in BULK silicon technologies are known to protect an IC against over-voltage conditions, e.g., ESD events. In known implementations, the SCR protection devices have been incorporated within the circuitry to provide a discharge path for the high current produced by the discharge of the high electrostatic potential. For example, once the ESD event is detected, the SCR changes to a conductive state to shunt the current to ground, the conductive state is maintained until the voltage is discharged to a safe level.

SCR technology has been implemented very successfully in BULK technologies; however, new integration schemes are needed for implementation in silicon-on-insulator (SOI) technologies. For example, in SOI technologies, the SCRs are formed directly on an insulator layer, which effectively isolates the SCR pwells which the cathodes are formed in one another when parallel fingers exist. This leads to uncoupled clamps (pwells)) such that upon a high current ESD event, only a limited number (e.g., single) of N+ diffusion cathodes turn on, while the remaining N+ diffusion cathodes remain turned off. This results in an unstable device which exhibits weak ESD performance.

Accordingly, there exists a need in the art to overcome the deficiencies and limitations described hereinabove.

SUMMARY

In a first aspect of the invention, a method comprises forming a common P-well on a buried insulator layer of a silicon on insulator (SOI) wafer. The method further comprises forming a plurality of silicon controlled rectifiers (SCR) in the P-well such that N+ diffusion cathodes of each of the plurality of SCRs are coupled together by the common P-well.

In another aspect of the invention, a method comprises forming a common P-well in a silicon film on a buried oxide layer of a silicon on insulator (SOI) wafer. The method further comprises forming a plurality of N-wells in the silicon film. The method further comprises forming an N-well contact in each of the plurality of N-wells. The method further comprises forming a plurality of anodes in each of the plurality of N-wells. The method further comprises forming P-well contacts in the common P-well. The method further comprises forming a plurality of cathodes in the P-well, each on opposing sides of each of the N-wells such that the plurality of cathodes are coupled together by the P-well.

In yet another aspect of the invention, a structure comprises a silicon on insulator wafer comprising a substrate, a buried insulator layer and a silicon film. The structure further comprises a common P-well in the silicon film on the buried insulator layer. The structure further comprises a plurality of silicon controlled rectifiers (SCRs) in the common P-well. The SCRs each comprise: an N-well surrounded by the common P-well, the N-well comprising a plurality of anodes and an N-well contact; and a plurality of cathodes formed in the common P-well such that each of the cathodes of the plurality of cathodes for each SCR are coupled together by the P-well. The structure further comprises a plurality of P-well contacts formed in the common P-well.

In yet another aspect of the invention, a method comprises triggering multiple P+ diffusion cathodes on opposing sides of an N-well and which are formed in a common P-well of a silicon on insulator wafer, upon an occurrence of a electrostatic discharge triggering event.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the silicon controlled rectifiers (SCR), which comprises the structures of the present invention. In still further embodiments, a method in a computer-aided design system is provided for generating a functional design model of the SCR. The method comprises generating a functional representation of the structural elements of the SCR.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to silicon controlled rectifiers (SCR), methods of manufacture and design structures. More specifically, the present invention comprises break-down SCR structures with uniform multi-finger triggering for electrostatic discharge (ESD) protection in a thick body silicon on insulator (SOI) wafer. The break-down SCR structures achieve improved ESD performance characteristics by providing a common P-well for the N+ diffusion cathodes (e.g., multi-fingers) of the SCR. In embodiments, the common P-well will electrically couple the N+ diffusion cathodes to one another effectively allowing all of the N+ diffusion cathodes to turn-on or trigger, e.g., conduct current, upon an occurrence of a low current triggering current. Advantageously, by implementing the SCR structure of the present invention it is possible to obtain high voltage break-down, low holding voltage and low capacitance for high performance applications. Also, the SCR structure may be used for enhanced ESD protection with faster circuit switching and reduced area on the substrate.

In comparison, conventional protection devices comprise N+ diffusion cathodes isolated from one another on top of an oxide of the SOI. As the cathodes are isolated from one another, only one N+ junction cathode triggers (e.g., turns on). That is, upon an ESD event, only a limited number (e.g., single) of N+ diffusion cathodes would turn on, while the remaining N+ diffusion cathodes remain turned off. This is due to the fact that the clamps are uncoupled, resulting in an unstable device which exhibits weak ESD performance.

Figure 1:
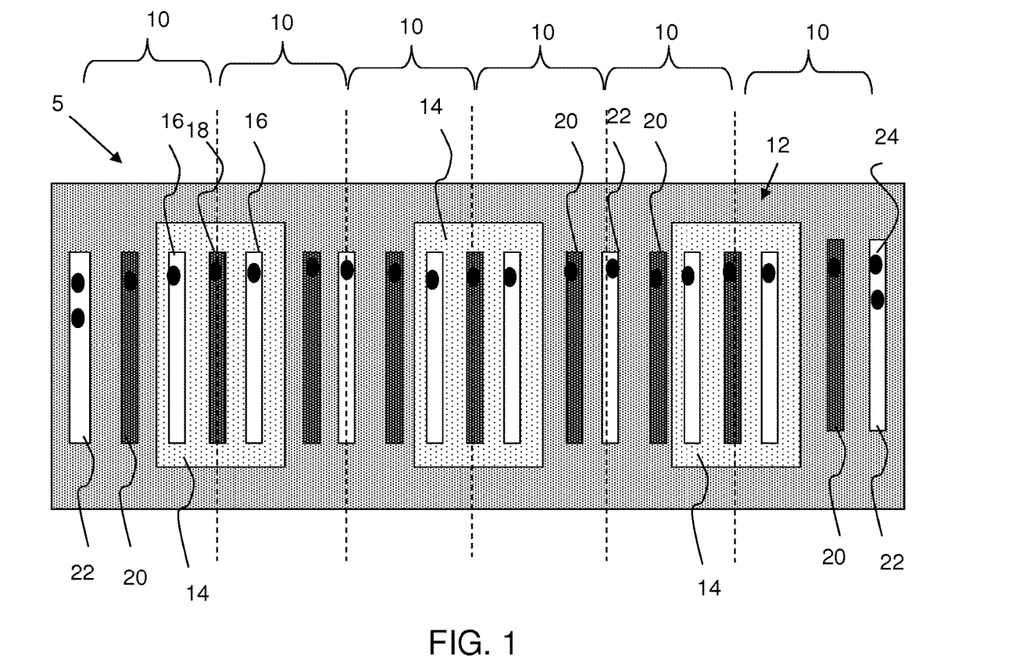
FIG. 1 shows a top view of a structure in accordance with aspects of the present invention.

FIG. 1 shows a top view of a structure in accordance with aspects of the present invention. In particular, the structure 5 includes a plurality of SCRs 10 formed in a common P-well 12. More specifically, the structure 5 is provided on an SOI wafer with a common P-well 12 formed on an oxide or insulator layer (not shown). In embodiments, the P-well 12 can be formed by doping a silicon film with a P-type dopant such as, for example, boron or $BF_2$. A plurality of N-wells 14 are formed by doping the silicon film, each having plurality of P+ diffusion anodes 16 (e.g., the anodes 16 are shorted to the N-well 14) and an N-type well contact 18. The N-wells 14 can be formed by doping the silicon film (or already formed P-well 12) with an N-type dopant such as, for example, phosphorous or arsenic.

The structure 5 further includes a plurality of N+ diffusion cathodes 20 formed in the common P-well 12 (e.g., surrounded by the P-well 12). The N+ diffusion cathodes 20 are coupled to one another in the common P-well 12, e.g., shorted in the P-well 12, which, in turn, permits uniform triggering during ESD events. That is, by placing the N+ diffusion cathodes 20 in the P-well 12, it is possible to provide a stable device that exhibits strong ESD performance, with multi-finger triggering during ESD events. Accordingly, the structure 5 of the present invention provides a break down SCR structure with uniform multi-finger triggering and uniform current density.

Still referring to FIG. 1, the structure 5 also includes a plurality of P-well contacts 22, formed in the P-well 12. The P-well contacts 22 include wiring and contacts 24, which connect each of the P-well contacts 22, in parallel. In embodiments, the N+ diffusion cathodes 20, P+ diffusion anodes 16 and N-well contacts 18 also include contacts 24, which can connect each of the respective N+ diffusion cathodes 20, P+ diffusion anodes 16 and N-well contacts 18, in parallel.

Figure 2:
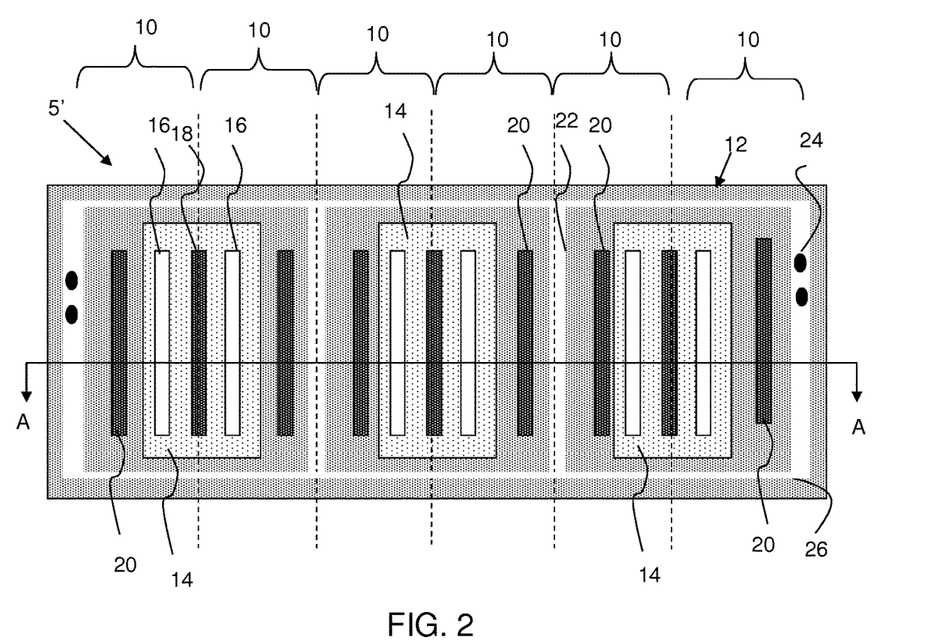
FIG. 2 shows a top view of another structure in accordance with aspects of the present invention.

FIG. 2 shows a top view of a structure in accordance with aspects of the present invention. In particular, the structure 5' includes a plurality of SCRs 10 formed in a P-well 12 and surrounded by a P+ doped structure 26. More specifically, the structure 5' is provided on an SOI wafer with a common P-well 12 formed on the oxide or insulator layer (not shown). In embodiments, the common P-well 12 can be formed by doping a silicon film with a P-type dopant such as, for example, boron or $BF_2$. A plurality of N-wells 14 are formed in the P-well 12, each having a plurality of P+ diffusion anodes 16 and an N-type well contact 18. The N-wells 14 can be formed by doping the P-well 12 with an N-type dopant such as, for example, phosphorous or arsenic.

The structure 5' further includes a plurality of N+ diffusion cathodes 20 formed in the P-well 12 (e.g., surrounded by the P-well 12). The N+ diffusion cathodes 20 are coupled to one another in the P-well 12 which, in turn, permits uniform triggering during ESD events, as discussed above. The structure 5' also includes P-well contacts 22, formed in the common P-well 12. A heavily doped P+ diffusion structure 26 connects the P-well contacts 22 to one another in the common P-well 12. The doped P+ diffusion structure 26 and the P-well contacts 22 form a ring structure at least around the N-wells 14. The heavily doped P+ diffusion structure 26 lowers the resistance of the structure 5'. In embodiments, the N+ diffusion cathodes 20, P+ diffusion anodes 16 and N-well contacts 18 include contacts 24, as discussed above.

Figure 3:
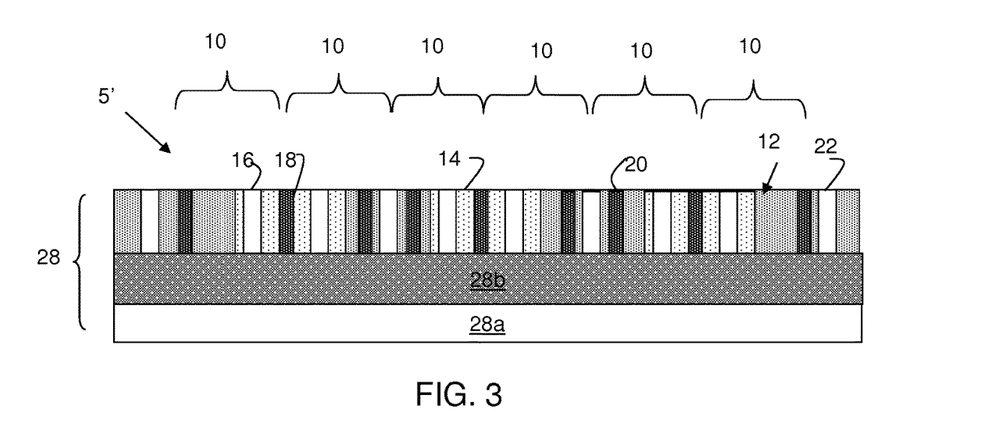
FIG. 3 shows a cross-sectional view of the structure of FIG. 2 along line A-A, in accordance with aspects of the present invention.

FIG. 3 shows a cross-sectional view of FIG. 2, along line A-A. FIG. 3 can also be representative of a cross-sectional view of FIG. 1, along the same cross sectional view.

As shown in FIG. 3, the structure 5' includes an SOI wafer 28. The SOI wafer 28 includes a substrate 28a and a buried insulator layer 28b, e.g., oxide. The substrate 28a and buried insulator layer 28b may be selected based on the desired end use application of the semiconductor device. The common P-well 12 is formed in an upper silicon film or other appropriate semiconductor material, directly on top of the insulator layer 28b. As shown in the representative cross-sectional view, the N+ diffusion cathodes 20, P+ diffusion anodes 16, N-wells 14, N-well contacts 18 and P-well contacts 22 are all surrounded by the common P-well 12, e.g., formed in the P-well 12, and above the insulator layer 28b. The common P-well 12 thus provides electrical coupling of the N+ diffusion cathodes 20.

Figure 4:
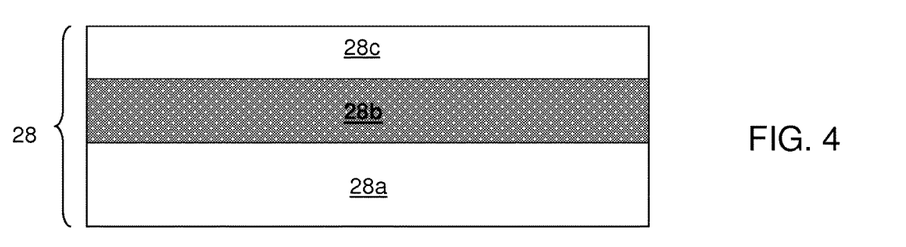
FIGS. 4-8 show processing steps and respective structures in accordance with aspects of the present invention.

FIGS. 4-8 show various processing steps and respective structures in accordance with aspects of the present invention. More specifically, FIG. 4 shows a beginning structure comprising an SOI wafer 28. The SOI wafer 28 includes a substrate 28a, a buried insulator layer 28b, e.g., oxide, and an upper Si based film 28c. The substrate 28a may be composed of any suitable material including, but not limited to, Si, SiGe, SiGeC, SiC, GE alloys, GaAs, InAs, InP, and other III/V or II/VI compound semiconductors. The buried insulator layer 28b may be composed of oxide, such as $SiO_2$, and may be referred to as a buried oxide (BOX) layer.

Figure 5:
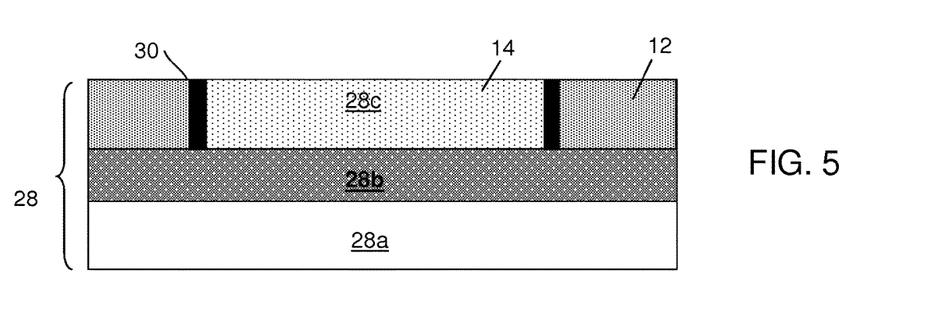

In FIG. 5, shallow trench isolation structures 30 can be formed in the film 28c using conventional lithographic, etching and deposition processes. For example, a resist can be formed on the film 28c and exposed to light to form patterns (openings). Trenches may then be formed in the film 28c using conventional etching processes such as, for example, reactive ion etching (RIE). The trenches may be filled with an insulator material such as, for example, oxide, to form the shallow trench isolation structures 30. The P-well 12 and N-wells 14 can be formed in the film 28c, over the buried insulator layer 28b. In embodiments, the P-well 12 can be formed prior to the N-wells 14; although, the present invention also contemplates the N-wells 14 being formed prior to the P-well 12.

In an illustrative non-limiting example, the P-well 12 is formed by doping p-type material into the film 28c such as, for example, boron or $BF_2$; whereas, the N-wells 14 are formed by doping n-type material into the film 28c such as, for example, phosphorous or arsenic. In embodiments, the doping density of the dopants can be, for example, at 1E16 $cm^{-3}$ to 1E18 $cm^{-3}$; although other doping densities are also contemplated by the present invention. The P-well 12 and the N-wells 14 are then subjected to an annealing process such as, for example, a rapid thermal anneal at 1000° C. for five seconds.

In embodiments, gate structures can be formed on the wells using conventional gate formation processes. For example, a gate insulator material and gate body material can be deposited on the wells, and etched or patterned to form gate structures. Sidewalls and/or spacers can also be formed on the gate structure using, for example, conventional deposition processes. The gate insulator material can be any gate insulator material such as, for example, oxide or an oxide based material such as, for example, hafnium oxide, oxy nitride, or other high-k dielectrics. The gate body can be a doped polysilicon, metal or combination of polysilicon and metal or metal alloy. The sidewalls and/or spacers can be, for example, nitride or oxide.

Figure 6:
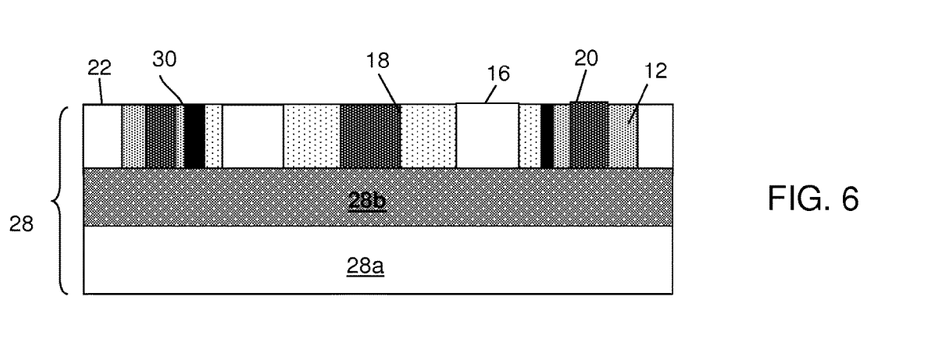

As shown in FIG. 6, the P+ diffusion anodes 16, N-well contacts 18, N+ diffusion cathodes 20 and P-well contacts 22 can be formed using conventional doping or implantation processes. For example, the P+ diffusion nodes 16, N-well contacts 18, N+ diffusion cathodes 20 and P-well contacts 22 can be formed during the formation processes of the N+ and P+ source and drain regions for the gate structures. In embodiments, the P+ diffusion anodes 16 and P+ contacts 22 are formed in the same processes steps as the P+ source and drain regions; whereas, the N+ diffusion cathodes 20 and N-well contacts 18 are formed in the same processing steps as the N+ source and drain regions. In embodiments, the doping density of the dopants can be, for example, at 1e20 $cm^3$ to 1e21 $cm^3$; although other doping densities are also contemplated by the present invention. The structure can then undergo a laser or flash anneal to activate the active areas of the device.

Figure 7:
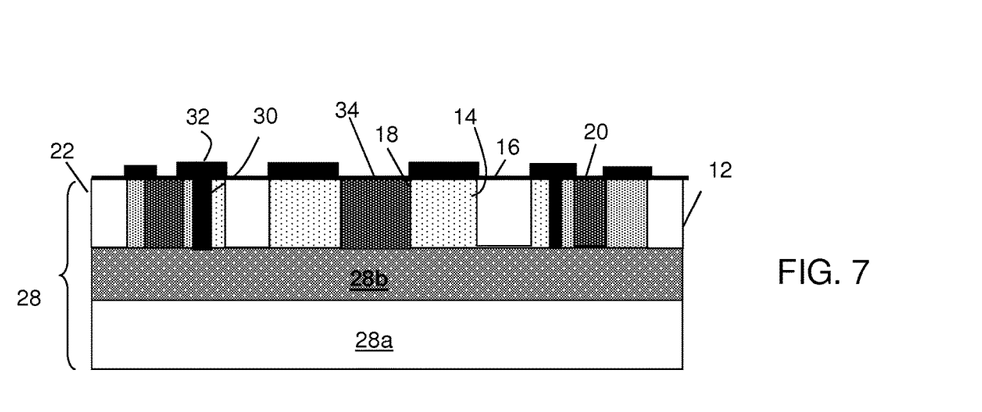

In FIG. 7, blocking material 32 such as, for example, nitride is deposited and patterned on regions which are not to be silicided. For example, the blocking material 32 is formed on the P-well 12 and N-wells 14, between the diffusions. A metal such as, for example, cobalt, nickel or titanium is deposited on the active regions and subject to thermal anneals forming silicide regions 34. In embodiments, the blocking material 32 can be removed using conventional stripping or planarization processes.

Figure 8:
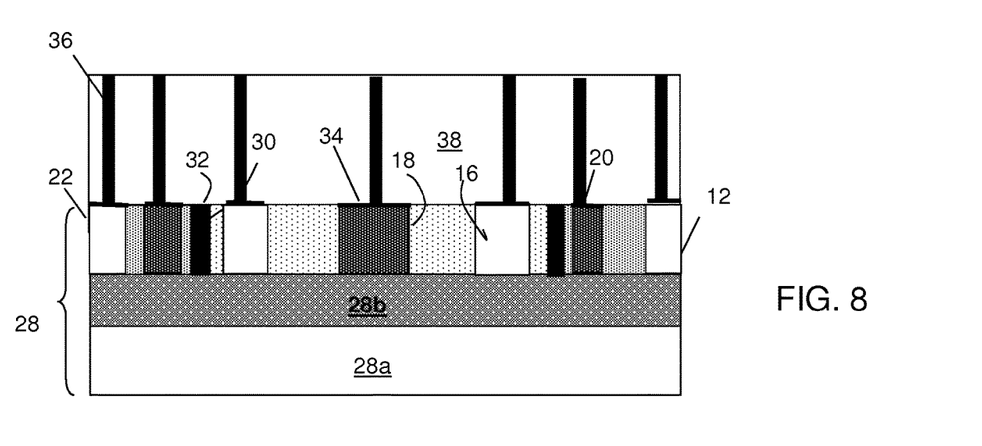

In FIG. 8, contacts 36 are formed using conventional lithographic, etching and deposition processes. For example, a dielectric layer 38 is formed (e.g., deposited using a conventional chemical vapor deposition (CVD)) on the structure of FIG. 7. A resist is placed on the dielectric layer 38 and exposed to light to form patterns (openings). The dielectric layer 38 is then etched to form trenches extending to the silicide regions 34 on the active regions. A metal is then deposited in the trenches to form the contacts 38. In embodiments, the metal may be tungsten.

Figure 9:
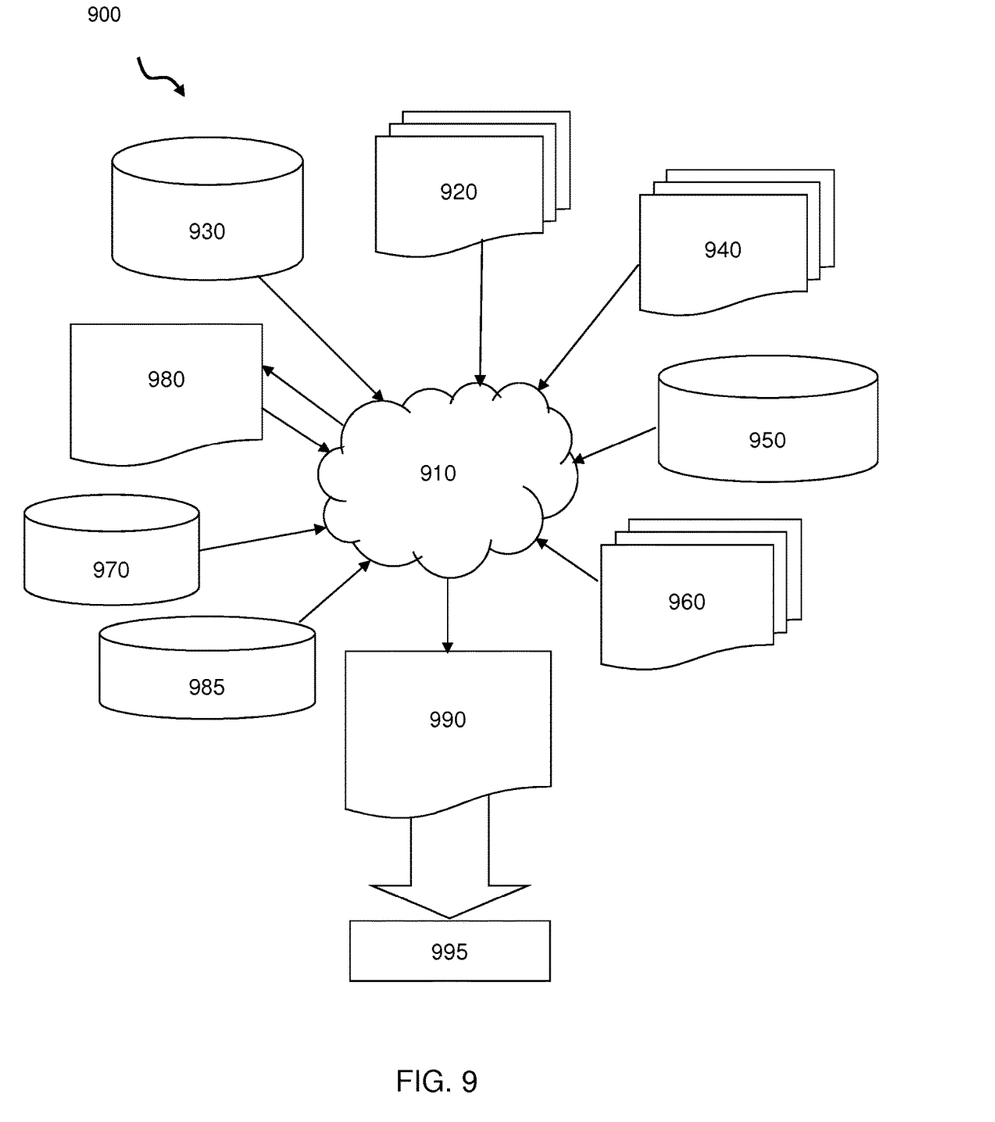
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8.

Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure, comprising:
   a silicon on insulator wafer comprising a substrate, a buried insulator layer and a silicon film;
   a common P-well in the silicon film on the buried insulator layer;
   a plurality of silicon controlled rectifiers (SCR) in the common P-well, the SCRs each comprising:
      an N-well surrounded by the common P-well, the N-well comprising a plurality of anodes and an N-well contact; and
      a plurality of cathodes formed in the common P-well such that each of the cathodes of the plurality of cathodes for each SCR are coupled together by the P-well, and each of the cathodes of the plurality of cathodes for each SCR directly contacts the buried insulator layer;
a plurality of P-well contacts formed in the common P-well; and
P+ diffusions connecting each of the P-well contacts, wherein the P+ diffusions connecting each of the P-well contacts form respective rings surrounding each N-well of the plurality of SCRs and a subset of the plurality of cathodes on opposing sides of each N-well,
wherein all the plurality of cathodes are structured to trigger upon occurrence of a triggering event.

2. The structure of claim 1, wherein the plurality of cathodes comprise a cathode on each side of each of the plurality of SCRs.

3. The structure of claim 1, wherein the structure is configured to trigger the plurality of cathodes upon an occurrence of a electrostatic discharge triggering event.

4. The structure of claim 1, wherein the plurality of P-well contacts are connected in parallel.

5. The structure of claim 1, wherein the common P-well is directly on a top surface of the buried insulator layer.

6. The structure of claim 1, wherein the P+ diffusions surround a pair of the plurality of cathodes on opposing sides of the N-well.

7. The structure of claim 6, wherein the P+ diffusions surround exactly a pair of the plurality of cathodes on opposing sides of the N-well.

8. The structure of claim 7, wherein the plurality of cathodes are separated from the N-well by the common P-well.

9. The structure of claim 8, wherein the structure comprising the plurality of SCRs has uniform multi-finger triggering and uniform current density.

10. The structure of claim 1, wherein the structure comprising the plurality of SCRs has uniform multi-finger triggering and uniform current density.

11. The structure of claim 1, wherein each one of the respective N-wells surrounded by the common P-well comprises a respective said N-well contact that extends through the respective N-well and directly contacts the buried insulator layer.

12. The structure of claim 11, wherein the respective N-well contacts are composed of N-type doped semiconductor material.

13. A structure, comprising:
a silicon on insulator wafer comprising a substrate, a buried insulator layer and a silicon film;
a common P-well in the silicon film on the buried insulator layer;
a plurality of silicon controlled rectifiers (SCR) in the common P-well comprising:
a first N-well and a second N-well each surrounded by the common P-well, the first N-well comprising a first plurality of anodes and a first N-well contact, and the second N-well comprising a second plurality of anodes and a second N-well contact;
a first plurality of cathodes formed in the common P-well on opposite sides of the first N-well, and a second plurality of cathodes formed in the common P-well on opposite sides of the second N-well, such that each of the cathodes of the first plurality of cathodes and the second plurality of cathodes are coupled together by the P-well, and each of the cathodes of the first plurality of cathodes and the second plurality of cathodes directly contacts the buried insulator layer;
a first P+ ring in the common P-well and surrounding the first N-well and the first plurality of cathodes;
a second P+ ring in the common P-well and surrounding the second N-well and the second plurality of cathodes,
wherein the first P+ ring and the second P+ ring have a common P+ region located between one of the first plurality of cathodes and one of the first plurality of cathodes, and
the first N-well contact and the second N-well contact each directly contacts the buried insulator layer.

14. The structure of claim 13, wherein the structure is configured to trigger the first plurality of cathodes and the second plurality of cathodes upon an occurrence of a electrostatic discharge triggering event.

15. The structure of claim 13, wherein the common P-well is directly on a top surface of the buried insulator layer.

16. The structure of claim 13, wherein:
the first N-well and the second N-well are comprised in a plurality of N-wells that are each surrounded by the common P-well; and
each one of the plurality of N-wells that is surrounded by the common P-well comprises:
two anodes; and
an N-well contact between the two anodes and directly contacting the buried insulator layer.

17. The structure of claim 13, wherein the first N-well contact and the second N-well contact each are composed of N-type doped semiconductor material.

18. A structure, comprising:
a silicon on insulator wafer comprising a substrate, a buried insulator layer and a silicon film;
a common P-well in the silicon film on the buried insulator layer;
a plurality of N-wells in the common P-well, the plurality of N-wells comprising: a first N-well comprising a first plurality of anodes and a first N-well contact between the first plurality of anodes and directly contacting the buried insulator layer; and a second N-well comprising a second plurality of anodes and a second N-well contact between the second plurality of anodes and directly contacting the buried insulator layer;
a first plurality of cathodes in the common P-well on opposite sides of the first N-well;
a second plurality of cathodes in the common P-well on opposite sides of the second N-well;
a first P+ ring in the common P-well and surrounding the first N-well and the first plurality of cathodes; and
a second P+ ring in the common P-well and surrounding the second N-well and the second plurality of cathodes,
wherein each of the cathodes of the first plurality of cathodes and the second plurality of cathodes for each SCR directly contacts the buried insulator layer; and
the first P+ ring and the second P+ ring share a common P+ region located between one of the first plurality of cathodes and one of the first plurality of cathodes.

19. The structure of claim 18, wherein every one of the plurality of N-wells that is in the common P-well comprises:
a respective plurality of anodes;
a respective N-well contact between the respective plurality of anodes and directly contacting the buried insulator layer.

20. The structure of claim 18, wherein the first N-well contact and the second N-well contact each are composed of N-type doped semiconductor material.

\* \* \* \* \*